United States Patent [19]

Cornelissen et al.

[11] Patent Number: 4,642,485

[45] Date of Patent: Feb. 10, 1987

[54] DIGITAL SWITCHING CIRCUIT HAVING INSULATED GATE FIELD EFFECT TRANSISTORS FOR CLAMPING THE NONCONDUCTIVE OUTPUT TRANSISTOR OFF

[75] Inventors: Bernardus H. J. Cornelissen; Henricus E. J. Wulms, both of Eindhoven, Netherlands

[73] Assignee: U.S. Philips Corporation, New York, N.Y.

[21] Appl. No.: 668,235

[22] Filed: Nov. 5, 1984

[30] Foreign Application Priority Data

Nov. 8, 1983 [NL] Netherlands ................... 8303835

[51] Int. Cl.[4] ................... H03K 19/003; H03K 19/094
[52] U.S. Cl. ................... 307/443; 307/200 B; 307/453; 307/550; 307/568; 307/575; 307/279
[58] Field of Search ........... 307/200 B, 443, 452–453, 307/481, 352, 353, 542, 550, 568, 571, 575, 577, 583, 279, 291

[56] References Cited

U.S. PATENT DOCUMENTS

| | | | |
|---|---|---|---|
| 3,986,046 | 10/1976 | Wunner | 307/481 |
| 4,345,172 | 8/1982 | Kobayashi et al. | 307/568 X |
| 4,348,601 | 9/1982 | Kitamura | 307/568 X |
| 4,477,741 | 10/1984 | Moser, Jr. | 307/443 X |
| 4,496,857 | 1/1985 | Chao | 307/279 X |
| 4,571,509 | 2/1986 | Tobita | 307/443 |

Primary Examiner—Stanley D. Miller
Assistant Examiner—D. R. Hudspeth
Attorney, Agent, or Firm—Robert T. Mayer; Steven R. Biren

[57] ABSTRACT

In a push-pull switching circuit, whose output transistors are controlled by complementary control signals, one of the gate electrodes which carries a "low" signal is kept just at the threshold voltage of the output transistor to be cut off by means of a transistor substantially identical to the output transistors, the gate electrode and the drain electrode of this transistor being interconnected. The junction of this gate and this drain is connected to the common of two cross-coupled transistors, which are connected by their drains to the gate electrodes of the respective output transistors.

6 Claims, 5 Drawing Figures

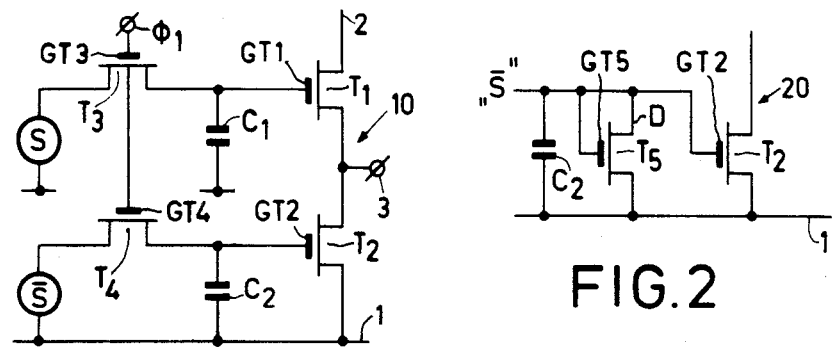
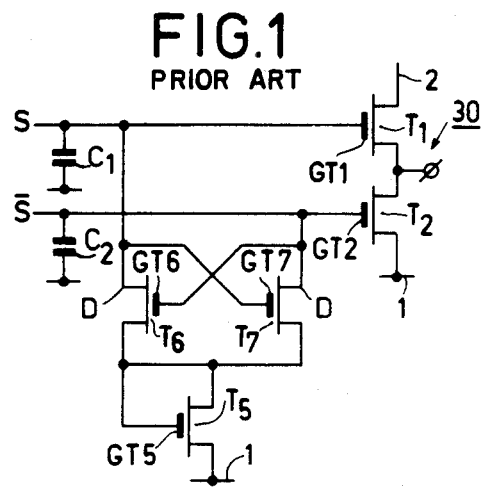
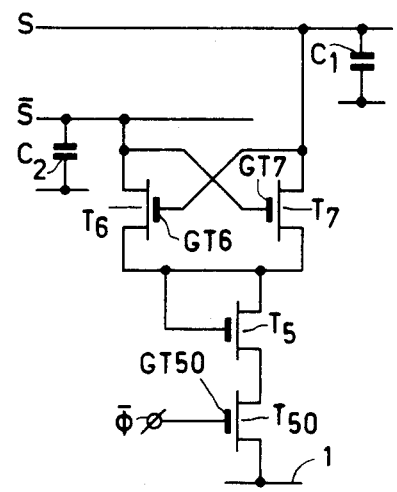
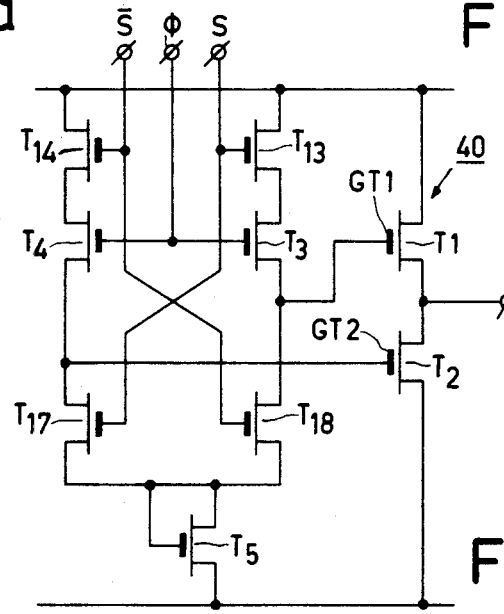
FIG.1 PRIOR ART
FIG.2
FIG.3a
FIG.3b
FIG.4

DIGITAL SWITCHING CIRCUIT HAVING INSULATED GATE FIELD EFFECT TRANSISTORS FOR CLAMPING THE NONCONDUCTIVE OUTPUT TRANSISTOR OFF

BACKGROUND OF THE INVENTION

The invention relates to a digital switching circuit which comprises first and second insulated gate field effect transistors, of which conduction channels located between main electrodes of the transistors are connected in series between a first and a second supply terminal. In operation the first transistor receives at its gate electrode a first control signal and the second transistor receives at its gate electrode a second control signal in a manner such that one of the transistors is rendered conducting and the other transistor is rendered non-conducting, the first control signal being an inverted version of the second control signal.

Such a circuit is known from the book "Large Scale Integration, Devices, Circuits and Systems", p. 276–277, published by "John Wiley and Sons Ltd.", New York 1981.

The circuit described in that book comprises a so-called "pushpull" output stage which comprises two transistors which are controlled by complementary signals D and $\overline{D}$. The low value of the signal D or $\overline{D}$ to be received by one of the transistors may be substantially 0 V, in order that this transistor is kept in the non-conducting condition with certainty. If this transistor has now to be rendered conducting, the potential at the gate electrode of this transistor should be increased from 0 V until this transistor is "fully" conducting. This means that at each transition from "low" to "high" (from the non-conducting to the concucting state) a maximum signal should be supplied, which results in an associated inertia and excessive dissipation. However, it is possible to produce the voltage sweep from "low" to "high" by choosing the "low" level for example just below the threshold voltage of the transistor to be rendered non-conducting. However, the problem then arises that while the potential level of the gate electrode is "low" due to capacitive coupling to its surroundings the potential level of this gate electrode is disturbed (increased), the transistor then becoming conductive. Circuits in which data signals are supplied together with clock signals and the gate electrodes have a floating potential after termination of the clock signals are highly sensitive to capacitive cross-talk, the more so if the data signals supplied to the control inputs are assisted by means of the so-called bootstrap technique.

SUMMARY OF THE INVENTION

The invention has for its object to provide a digital switching circuit which requires a smaller voltage sweep as a control signal and which is insensitive to capacitive cross-talk.

For this purpose, a digital switching circuit according to the invention is characterized in that the gate electrodes of the first and the second transistor are connected to switchable clamping means which when operative keep the gate electrode of the non-conducting transistor at a voltage level equal to or smaller than the threshold voltage of the non-conducting transistor.

A digial switching circuit according to the invention may be further characterized in that the switchable clamping means comprise switching means and a third insulated gate field effect transistor, of which third transistor a first main electrode is connected to a supply terminal and a second main electrode is connected to the gate electrode of the third transistors and is connected via the switching means to the gate electrode of the non-conducting transistor.

Preferably such a digital switching circuit arrangement according to the invention is further characterized in that the first, the second and the third transistor are formed on a substrate very close to each other. This has the advantage that the threshold voltage of all three transistors, which are temperature-dependent, are determined by (substantially) the same temperature because all three transistors are situated in the same region on the substrate.

BRIEF DESCRIPTION OF THE DRAWING

Embodiments of the invention will be described by way of example, with reference to the drawing, in which:

FIG. 1 shows a switching circuit according to the prior art;

FIG. 2 shows diagrammatically a possible construction for part of a switching circuit according to the invention;

FIGS. 3a and 3b show an example of a switching circuit according to the invention and a part thereof, respectively; and FIG. 4 shows a further embodiment of the invention.

DESCRIPTION OF THE PREFERRED EMBODIMENTS

The switching circuit 10 shown in FIG. 1 comprises a first and a second field effect transistor T1 and T2 having insulated gates GT1 and GT2. The transistors T1 and T2 of the "enhancement" type are connected in series between two supply voltage terminals 1 and 2, while an output terminal 3 is connected to a junction between the two transistors T1 and T2. The gate electrodes GT1 and GT2 and the signal leads connected thereto have, as is generally known, parasitic capacitances, which limit the switching speed of the switching circuit 10. Transistors T3 and T4 control signals S and $\overline{S}$ are supplied to the gate electrodes GT1 and GT2 via field effect of a clock signal $\phi$, which is supplied to the gate electrodes GT3 and GT4, has a "high" level. The signal $\overline{S}$ is the inverted signal S and consequently has a "low" level if the signal S is "high", and conversely. The signal S and $\overline{S}$ satisfies the following requirements: if the signal S is "high", the transistor T1 is fully conducting ($\overline{S}$ is "low" and the transistor T2 is non-conducting); if the signal S is "low", the transistor T1 is non-conducting ($\overline{S}$ is "high" and the transistor T2 is fully conducting). Consequently, one of the transistors T1 and T2 is always conducting, whereas the other is non-conducting. The requirement that one transistor is non-conducting has also to be guaranteed if the supply voltage is 10% above the nominal value and the transistors have the lowest admissible threshold voltage. If this requirement is not satisfied, under these conditions the output stage will conduct DC current and will consequently dissipate energy. The requirement that one transistor is fully conducting has also to be guaranteed at a supply voltage which is 10% below the nominal value, when the transistors have the highest admissible threshold voltage. Otherwise, the output signal under these conditions cannot be switched in the desired manner (switching speed) from "high" to "low", and conversely.

If the check signal $\phi$ is "high", the transistors T3 and T4 are conducting and, if the signal S is "high" (and consequently the signal $\bar{S}$ is "low"), the capacitance C1 will be charged to the level of the signal S (and C2 will consequently be discharged to the "low" level of $\bar{S}$). In this situation, the transistor T1 will be conducting and the transistor T2 will be non-conducting. The above situation is maintained if the clock signal $\phi$ changes from "high" to "low" as a result of which the transistors T3 and T4 will become non-conducting and the capacitances C1 and C2 remain in the charge condition described above. If the voltage across the capacitance C2 (=the voltage difference between the terminal 1 and the gate electrode GT1) is equal to zero V, the transistor T2 will certainly be cut off.

If now the signal S becomes "low" and the signal $\bar{S}$ becomes "high", if the clock signal $\phi$ renders the transistors T3 and T4 conducting, the voltage across the capacitance C2 will have to increase from 0 V to a voltage at which the transistor T2 is fully conducting. The transition of voltage level from "low" to "high" at the capacitance C2 is then larger than is necessary, however, and this means a high dissipation. The voltage level across the capacitance C2 need not be lower than just below the threshold voltage of the transistor T2, however, to render it non-conducting. The transition of the voltage level from "low" to "high" would therefore then be smaller. However, this situation has the disadvantage that the capacitance C2 (if clock signal $\phi$ is again "low") is not held actively at the adjusted voltage. The gate electrode GT2 and the signal lead coupled to it are floating, are capacitively coupled to their surroundings and are consequently sensitive to capacitive cross talk.

FIG. 2 shows diagrammatically a part of 20 of a possible construction of a switching circuit according to the invention, which comprises a third transistor T5. The third transistor, connected as a "diode" and denoted by T5, is connected to the signal lead which is connected to the gate electrode GT2 and is connected at it's other main electrode to supply terminal 1. The transistor T5, whose gate electrode GT5 is connected to a first main electrode (drain) D thereof has a threshold voltage substantially equal to or slightly smaller than that of the transistor T2. If the transistor T2 is current-conducting, the transistor T5 will also be current-conducting. Therefore, with "S" open-circuit, the capacitance C2 is discharged, which results in that the voltage at the gate electrodes GT5 and GT2 decreases. The voltage decrease will continue until the transistor T5 becomes non-conducting, which means that the voltage at the gate electrodes GT5 and GT2 has decreased to the threshold voltage of the transistor T5. The transistor T2 will therefore also be rendered non-conducting. Any capacitive cross-talk effects on the gate electrode GT5 (and GT2) of the transistor T2 (and T5), which give rise to an increase of the voltage at the electrodes GT2 and GT5, are immediately eliminated by the transistor T5 and the gate voltage at the electrode GT2 of the transistor T2 is automatically adjusted to the highest possible "low" level (the threshold voltage).

A subsequent voltage transition from "low" to "high" is consequently reduced to a minimum. Of course, the transistor T5 should be switched off if a "high" signal is supplied to the gate electrode GT2 and the transistor T2 has to be rendered conducting. The facts stated above about the drive of the transistor T2 by the signal $\bar{S}$, the gate electrode GT2 and the parasitic capacitance C2 of course also apply to the drive of the transistor T1 by the signal S, the gate electrode GT1 and the parasitic capacitance C1.

FIG. 3a shows an example of a switching circuit 30 according to the invention, which comprises the third transistor T5 and switching means T6 and T7. The transistor T5, connected as a "diode", is connected via two cross-coupled transistors T6 and T7 to the gate electrodes Gt1 and GT2. On the assumption that the signal "S" is "high" and the signal "$\bar{S}$" is "low", the transistor T7, whose gate electrode GT7 is connected to the gate electrode GT1, will invariably be in the conductive state, as a result of which the voltage across the capacitance C2 is held via the transistor T7 and through the transistor T5 just at the threshold voltage of the transistor T2. The gate electrode GT6 is connected to the gate electrode GT2 carrying a "low" signal level so that the transistor T6, which is connected through a main electrode D to the gate electrode GT1 which carries a "high" voltage level, is fully cut off. The capacitance C1 is therefore not discharged.

If the signal S is "low" and the signal $\bar{S}$ is "high", the signals S and $\bar{S}$ will be supplied, as soon as the clock signal $\phi$ becomes "high", to the capacitances C1 and C2 and to the gate electrodes GT1 and GT2 so that the capacitance C1 is discharged and the capacitance C2 is charged. The discharge path constituted by the transistors T7 and T5 will cause a part of the current supplied by the signal $\bar{S}$ to flow away. If this is found to be annoying, the discharge path via the transistor T7 (or T6) and T5 to the supply terminal 1 can be interrupted. A buffer transistor T50 can be connected for this purpose between the transistor T5 and the supply terminal 1, as is shown in FIG. 3b, and receive at its gate electrode GT50 the inverted clock signal $\bar{\phi}$. Consequently, the buffer transistor T50 will be rendered non-conducting if the signal $\bar{\phi}$ is "low" (the clock signal $\phi$ is then "high"). Therefore, the aforementioned discharge path (see FIG. 3a) via the transistor T6 (or T7) and T5 is interrupted if the clock signal $\phi$ is "high" and the capacitances C1 and C2 are charged and discharged, respectively, or conversely. As soon as the potential at the gate electrode GT2 becomes higher than that at the gate electrode GT1, the cross-coupled circuit arrangement of transistors T6 and T7 will "change over". The transistor T6 becomes conducting and the transistor T7 becomes non-conducting, which ultimately results in that the capacitance C1 will be discharged to the threshold voltage of the transistor T5 (which is identical to the transistor T1 to the greatest possible extent), as a result of which the transistor T5 will become non-conducting and the capacitance C2 will be charged to the "high" level of the signal $\bar{S}$ so that the transitors T2 becomes conducting. If now the clock signal $\phi$ becomes "low" the inverter circuit 30 will (continuously) be in a stable condition.

FIG. 4 shows a further embodiment of the invention in the form of a circuit 40. The control signals S and $\bar{S}$ are supplied to the gate electrodes of the transistors T13 and T17 and to the gate electrodes of the transistors T14 and T18, respectively. If the clock signal $\phi$ becomes "high", the transistors T3 and T4 will be conducting and the signals S and $\bar{S}$ will determine the voltage level at the gate electrodes GT1 and GT2. If S is "high" ($\bar{S}$ is "low"), the transistors T13 and T17 will be conducting and the transistors T14 and T18 will be non-conducting.

Since the transistors T13 and T3 are conducting and the transistor T18 is non-conducting, a "high" voltage level will be at the gate electrode GT1 and the transistor T1 will be conducting. The gate electrode GT2 of the transistor T2 obtains a "low" voltage level because the transistor T14 is non-conducting and the transistors T17 and T5 will be conducting until the voltage present at the gate electrode GT2 and across parasitic capacitances has decreased to the threshold voltage of the transistor T5. The threshold voltage of T2 is equal to or slightly larger than the threshold voltage of the transistor T5 so that the transistor T2 is also non-conducting. This situation is maintained if the clock signal $\phi$ becomes "low" and remains so.

If the signal S obtains a "low" level ($\overline{S}$ consequently becomes "high"), the transistors T14 and T18 will become conducting. Since the transistor T3 is non-conducting ($\phi$ is "low"), the voltage at the gate electrode GT1 will decrease because the charge present there (and in the parasitic capacitances) leaks away via the transistors T18 and T5 until the threshold voltage of T5 is reached and this transistor becomes non-conducting. At that instant, the threshold voltage of the transistor T1 is also reached so that both the transistor T1 and the transistor T2 become non-conducting (the output of the circuit has now a high inipedance).

If in the above situation the clock signal $\phi$ becomes "high", the gate electrode GT2 will obtain a "high" voltage level via the transistors T14 and T4 (transistor T17 is non-conducting because S is "low"). The transistor T2 will now be conducting and the transistor T1 remains non-conducting.

What is claimed is:

1. A digital switching circuit which comprises first and second insulated gate field effect transistors, conduction channels located between source and drain electrodes of the transistors being connected in series between a first and a second supply terminal, in operation the first transistor receiving at its gate electrode a first control signal and the second transistor receiving at its gate electrode a second control signal such that one of the transistors is rendered conducting and the other transistor is rendered non-conducting, the first control signal being an inverted version of the second control signal, and switchable clamping means, characterized in that the gate electrodes of the first and the second transistors are connected to said switchable clamping means for keeping the gate electrode of only the non-conducting transistor at a voltage level equal to or lower than the threshold voltage of the non-conducting transistor.

2. A digital switching circuit as claimed in claim 1, characterized in that the switchable clamping means comprises switching means and a third insulated gate field effect transistor, one of the source and drain electrodes of said third transistor being connected to one of said supply terminals and the other of said source and drain electrodes being connected to its gate electrode and through the switching means to the gate electrode of the non-conducting transistor.

3. A digital switching circuit as claimed in claim 2, characterized in that the switching means comprises a fourth and fifth insulated gate field effect transistor which are cross-coupled and of which a junction of the gate electrode of the fifth transistor and one of the source and drain electrodes of the fourth transistor is connected to the gate electrode of the first transistor, while a junction of a gate electrode of the fourth transistor and one of the source and drain electrodes of the fifth transistor is connected to the gate electrode of the second transistor, and in that a junction of the other of the source and drain electrodes of the fourth and the fifth transistors is connected to the other of said source and drain electrodes of the third transistor.

4. A digital switching circuit as claimed in claim 2 or 3, characterized in that the third transistor has a threshold voltage which is lower than or equal to the threshold voltages of the first and second transistors.

5. A digital switching circuit as claimed in claim 2 or 3, characterized in that the first, the second and the third transistors are formed adjacent each other on a substrate.

6. A digital switching circuit as claimed in claim 1, 2 or 3, further comprising a buffer transistor, characterized in that the switchable clamping means is connected to one of said supply terminals by said buffer transistor, which buffer transistor receives a control signal which renders the buffer transistor non-conducting when the control signals supplied to the gate electrodes of the first and the second transistor are changing level.

* * * * *